(12) United States Patent
Wang et al.

(10) Patent No.: US 10,170,481 B2
(45) Date of Patent: Jan. 1, 2019

(54) SEMICONDUCTOR MEMORY DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Ying-Chiao Wang, Changhua County (TW); Li-Wei Feng, Kaohsiung (TW); Chien-Ting Ho, Taichung (TW); Tsung-Ying Tsai, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/915,026

(22) Filed: Mar. 7, 2018

(65) Prior Publication Data

US 2018/0277546 A1 Sep. 27, 2018

(30) Foreign Application Priority Data

Mar. 24, 2017 (CN) .......................... 2017 1 0180914

(51) Int. Cl.
*H01L 27/108* (2006.01)
*H01L 21/762* (2006.01)
*H01L 29/06* (2006.01)

(52) U.S. Cl.
CPC .. *H01L 27/10894* (2013.01); *H01L 21/76224* (2013.01); *H01L 27/10805* (2013.01); *H01L 27/10814* (2013.01); *H01L 27/10823* (2013.01); *H01L 27/10885* (2013.01); *H01L 27/10897* (2013.01); *H01L 29/0649* (2013.01)

(58) Field of Classification Search
CPC ......... H01L 27/10805; H01L 27/10823; H01L 27/10894
See application file for complete search history.

(56) References Cited

U.S. PATENT DOCUMENTS

| | | | |
|---|---|---|---|
| 9,287,395 B2 | 3/2016 | Jeong | |
| 9,431,324 B2 | 8/2016 | Shin | |
| 9,859,283 B1 * | 1/2018 | Feng | H01L 27/10885 |
| 2003/0036233 A1 * | 2/2003 | Chen | H01L 21/28518 |
| | | | 438/261 |
| 2006/0270153 A1 * | 11/2006 | Lee | H01L 27/10876 |
| | | | 438/253 |

(Continued)

OTHER PUBLICATIONS

Chen, Title of Invention: Manufacturing Method of Semiconductor Memory Device, U.S. Appl. No. 15/894,947, filed Feb. 13, 2018.

*Primary Examiner* — Asok K Sarkar
*Assistant Examiner* — Grant Withers
(74) *Attorney, Agent, or Firm* — Winston Hsu

(57) ABSTRACT

A semiconductor memory device and a method of forming the same, the semiconductor memory device includes a substrate, a plurality of bit lines, a gate, a spacer layer and a first spacer. The substrate has a memory cell region and a periphery region, the a plurality of bit lines are disposed on the substrate, within the memory cell region, and the gate is disposed on the substrate, within the periphery. The spacer layer covers the bit lines and a sidewall of the gate. The first spacer is disposed at two sides of the gate, covers on the spacer layer.

16 Claims, 9 Drawing Sheets

(56) References Cited

U.S. PATENT DOCUMENTS

| | | | |
|---|---|---|---|
| 2009/0004855 A1* | 1/2009 | Lee | H01L 21/76895 438/669 |
| 2009/0121278 A1* | 5/2009 | Lin | H01L 21/28282 257/324 |
| 2014/0291804 A1* | 10/2014 | Kim | G11C 11/4099 257/532 |
| 2018/0122809 A1* | 5/2018 | Lin | H01L 27/10894 |
| 2018/0190656 A1* | 7/2018 | Ho | H01L 27/1052 |
| 2018/0226410 A1* | 8/2018 | Chang | H01L 27/10885 |
| 2018/0254277 A1* | 9/2018 | Chen | H01L 27/10847 |
| 2018/0261603 A1* | 9/2018 | Wang | H01L 27/10885 |

* cited by examiner

SEMICONDUCTOR MEMORY DEVICE AND METHOD OF FORMING THE SAME

BACKGROUND OF THE INVENTION

1. Field of the Invention

The present invention relates generally to a semiconductor memory device and a method of fabricating the same. More particularly, the present invention relates to a dynamic random access memory (DRAM) device and a method of forming a spacer located in the periphery region of a DRAM device.

2. Description of the Prior Art

A dynamic random access memory (DRAM) is a volatile memory, which is an indispensable element in many electronic products. A large number of memory cells to form an array area for storing data integrates DRAM. Each memory cell may be composed of a metal oxide semiconductor (MOS) transistor in series with a capacitor.

The MOS transistor structure of the memory cell has many different structural designs because considerations of product demands and/or memory cell density. Therefore, the MOS transistor structure of the memory cell may sometimes differ from those of other regions on the same chip, and thus resulting in increased process complexity. Thus, how to integrate effectively the MOS transistor of the memory cell and the different transistors in other regions is a very important issue for the related industries.

SUMMARY OF THE INVENTION

The present invention provides a method of fabricating a semiconductor memory device. The method includes forming a spacer layer covered a plurality of bit lines and a portion of a gate at the same time and using the spacer layer as an etch stop layer for a subsequent etching process to prevent damage of other elements caused by the etching process.

The present invention further provides a semiconductor memory device having an asymmetrical spacer structure on a gate in the periphery region to protect the underlying elements from being damaged by subsequent etching processes.

To achieve the above object, one embodiment of the present invention provides a method of fabricating a semiconductor memory device including the following steps. First, a substrate is provided, wherein the substrate includes a memory cell region and a periphery region. Next, a plurality of bit lines and a gate are formed on the substrate, wherein the bit lines are located within the memory cell region and the gate is located within the periphery region. Then, a spacer layer is formed, wherein the spacer layer covers the bit lines and a sidewall of the gate. Finally, a first spacer is formed on the sidewall and an opposite sidewall of the gate, wherein the first spacer covers the spacer layer.

To achieve the above object, one embodiment of the present invention provides a semiconductor memory device including a substrate, a plurality of bit lines, a gate, a spacer layer, and a first spacer. The substrate includes a memory cell region and a periphery region. The bit lines are disposed on the substrate, within the memory cell region. The gate is disposed on the substrate, within the periphery region. The spacer layer covers the bit lines and a sidewall of the gate. The first spacer is disposed on the sidewall and an opposite sidewall of the gate and covers the spacer layer.

The present invention utilizes the difference between the area covered by two masks, so that the spacer layer which is formed first can be used as an etch stop layer in a subsequent etching process so as to prevent the etching process from being over etched downward and damaging the components in the substrate. Thus, the semiconductor memory device achieved by the aforementioned formation method can have an optimized structural feature and achieve better device performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic views of steps of a method of fabricating a semiconductor memory device according to a first preferred embodiment of the present invention, wherein:

FIG. 1 is a schematic cross-sectional view of a semiconductor memory device at the beginning of the method;

FIG. 2 is a schematic cross-sectional view of a semiconductor memory device after forming a material layer;

FIG. 3 is a schematic cross-sectional view of a semiconductor memory device after forming a mask;

FIG. 4 is a schematic cross-sectional view of a semiconductor memory device after forming another material layer;

FIG. 5 is a schematic cross-sectional view of a semiconductor memory device after forming another mask;

FIG. 6 is a schematic cross-sectional view of a semiconductor memory device after performing an etching process;

FIG. 7 is a schematic cross-sectional view of a semiconductor memory device after forming a dielectric layer.

FIG. 8 to FIG. 9 are schematic views of steps of a method of fabricating a semiconductor memory device according to a second preferred embodiment of the present invention, wherein:

FIG. 8 is a schematic cross-sectional view of a semiconductor memory device after forming a mask;

FIG. 9 is a schematic cross-sectional view of a semiconductor memory device after forming a dielectric layer.

DETAILED DESCRIPTION

Figure 1:
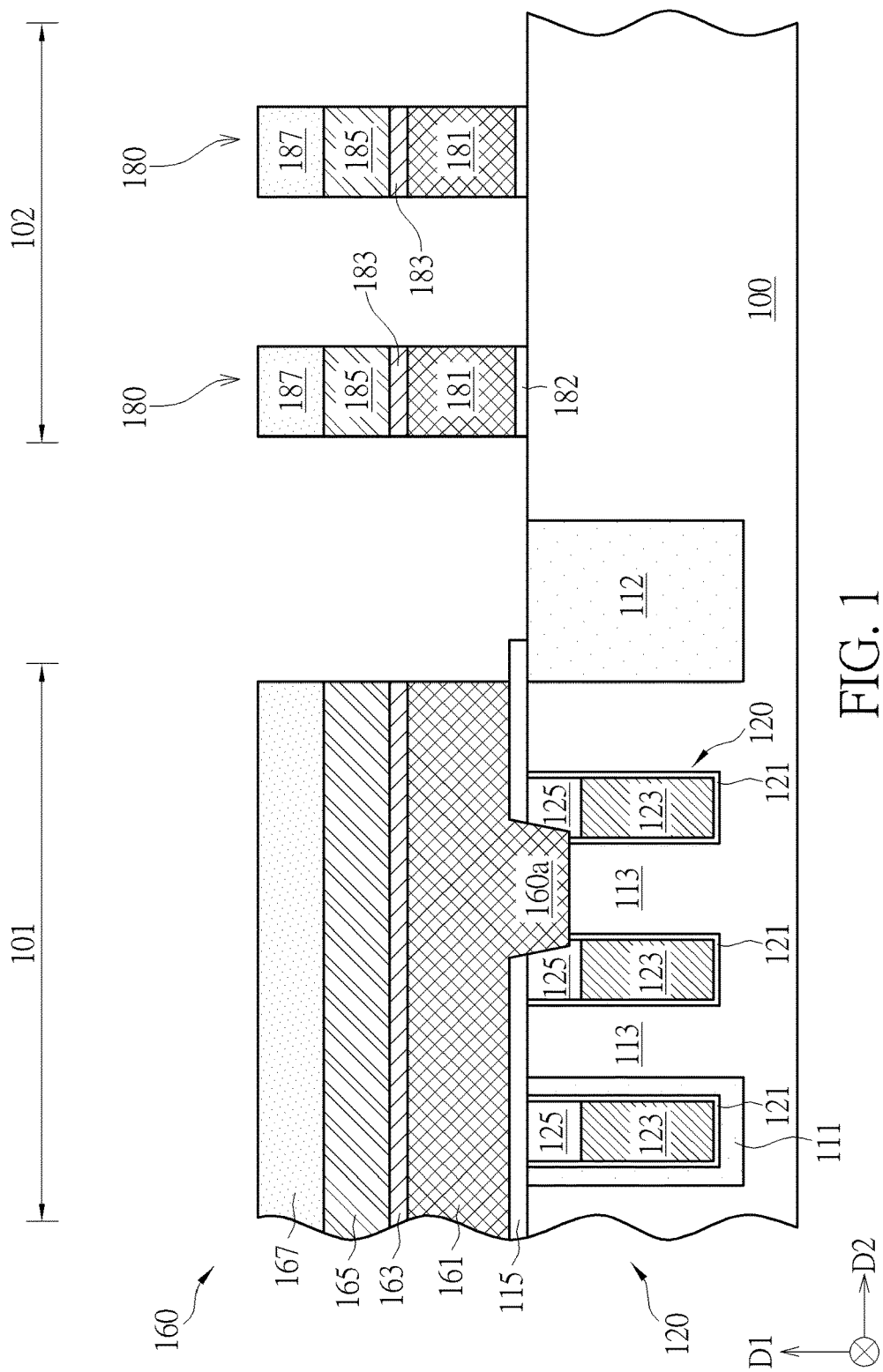

In the following, the preferred embodiments of the present invention are described in order to enable those skilled in the art to further understand the present invention. The preferred embodiments may refer to the corresponding drawings to illustrate details of the constitution of the present invention and the effects to be achieved.

Please refer to FIG. 1 to FIG. 7, which are schematic views of steps of a method of fabricating a semiconductor memory device according to a preferred embodiment of the present invention. The semiconductor memory device may be, for example, a dynamic random access memory (DRAM) device that includes at least one transistor (not shown) and at least one capacitor (not shown) as the smallest memory cell in the DRAM array and receives voltage signals from the bit line (BL) 160 and the word line (WL) 120.

In this embodiment, the semiconductor memory device includes a substrate 100, such as a silicon substrate, silicon-contained substrate (such as SiC, SiGe), or a silicon-on-insulator (SOI) substrate. A memory cell region 101 and a periphery region 102 are defined on the substrate 100. In addition, at least one shallow trench isolation (STI) is formed on the substrate 100. In this embodiment, the shallow trench isolation 111 may be formed in the memory cell region 101 of the substrate 100, and a plurality of active regions (AA) 113 may be defined on the memory cell region 101 of the substrate 100. On the other hand, the isolation effect can be achieved by forming a shallow trench isolation 112 in the substrate 100 between the periphery region 102 and the memory cell region 101 of the substrate 100. For example, the shallow trench isolation 111 and 112 are formed by forming a plurality of trenches in the substrate 100 by an etching process and then filling an insulating material (such as silicon oxide or silicon oxynitride) in the trenches, but is not limited thereto.

A plurality of word lines may also be formed in the memory cell region 101 of the substrate 100, preferably forming a buried word line (BWL) 120 in the substrate 100, but is not limited thereto. In this embodiment, each of the buried word lines 120 is parallel to each other and extends along a first direction D1 (for example, the y direction) and traverses the active regions 113 and the shallow trench isolation 111, so that a portion of the buried word lines 120 is buried in the shallow trench isolation 111 and the other portion of buried word line 120 is buried in the active regions 113, as shown in FIG. 1. Each buried word line 120 includes at least one gate dielectric layer 121 including such as silicon oxide (SiO), and a gate layer 123 including metal with low resistance, for example, tungsten (W), aluminum (Al), or copper (Cu), and a capping layer 125 including an insulating material such as silicon nitride (SiN), silicon oxynitride (SiON), silicon carbonitride (SiCN) and the like. The gate dielectric layer 121, the gate layer 123 and the capping layer 125 can be formed by forming a plurality of trenches (not shown) in the substrate 100 and then performing a deposition, etching and planarization processes to sequentially forma gate dielectric layer 121 covering the entire surface of the trenches, a gate layer 123 filling the lower half of the trenches, and a capping layer 125 filling the upper half of the trenches, wherein the capping layer 125 may be flush with the surface of the substrate 100.

Next, as shown in FIG. 1, a bit line 160 and a gate 180 are formed on the memory cell region 101 and the periphery region 102 of the substrate 100, respectively. The bit line 160 extends along a second direction D2 (for example, the x direction) different from the first direction D1 and simultaneously traverses the active regions 113, the shallow trench isolation 111 and buried word line 120. Each of the bit lines 160 includes a semiconductor layer 161, a barrier layer 163, a metal layer 165 and a mask layer 167 stacked in sequence. The gate 180 includes a gate dielectric layer 182, a gate layer 181, a barrier layer 183, a metal layer 185 and a mask layer 187. In one embodiment, the gate 180 and the bit line 160 are formed together. The bit line 160 and the gate 180 are respectively formed in the memory cell region 101 and the periphery region 102 by patterning a stacked structure, but are not limited thereto.

For example, a semiconductor layer (not shown), such as a semiconductor material including polysilicon or amorphous silicon, a barrier layer (not shown), such as titanium (Ti) or titanium nitride (TiN), a metal layer (not shown), such as a metal with low resistance including tungsten, aluminum or copper, and a mask layer (not shown) including silicon oxide, silicon nitride or silicon carbonitride, are sequentially formed on the substrate 100 to form the stacked structure. Next, the stacked structure is further patterned to form the bit line 160 and the gate 180. In this way, the patterned semiconductor layer constitutes the semiconductor layer 161 of the bit line 160 and the gate layer 181 of the gate 180, the patterned barrier layer constitutes the barrier layer 163 of the bit line 160 and the barrier layer 183 of the gate 180, the patterned metal layer forms the metal layer 165 of the bit line 160 and the metal layer 185 of the gate 180, and the patterned mask layer constitutes the mask layer 167 of the bit line 160 and the mask layer 187 of gate 180.

Before the stacked structure is formed, the insulating layer 115 and the gate dielectric layer 182 may be respectively formed on the memory cell region 101 and the periphery region 102 of the substrate 100. In one embodiment, the insulating layer 115 and the gate dielectric layer 182 may also be formed by patterning the same dielectric layer (not shown) on the surface of the substrate 100, but are not limited thereto. In addition, the insulating layer 115 located in the memory cell region 101 covers the word line 120, the shallow trench isolation 111, and the active region 113. Subsequently, at least one opening (not shown) may be formed on the surface of the substrate 100 to penetrate through the insulating layer 115 and expose a portion of the active region 113, so that the semiconductor layer of the stacked structure may fill the opening, thereby forming a bit line contact (BLC) plug integrated with the semiconductor layer 161 of the bit line 160, as shown in FIG. 1. That is to say, the bit line contact plug 160a is located under the bit line 160 and between two adjacent buried word lines 120. The bit line 160 is electrically connected to a source/drain region (not shown) of each of the semiconductor memory devices.

Figure 2:
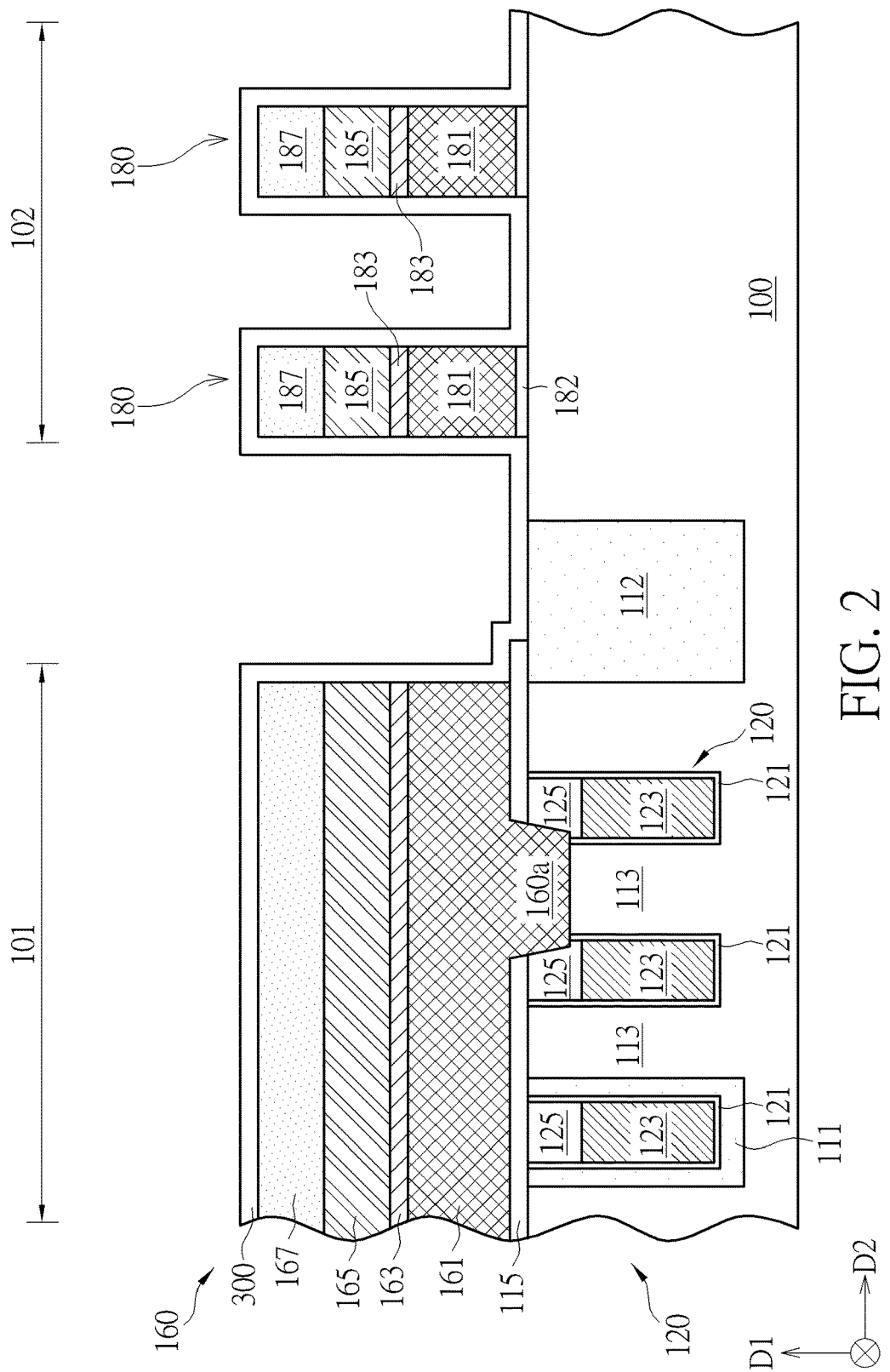
Figure 3:
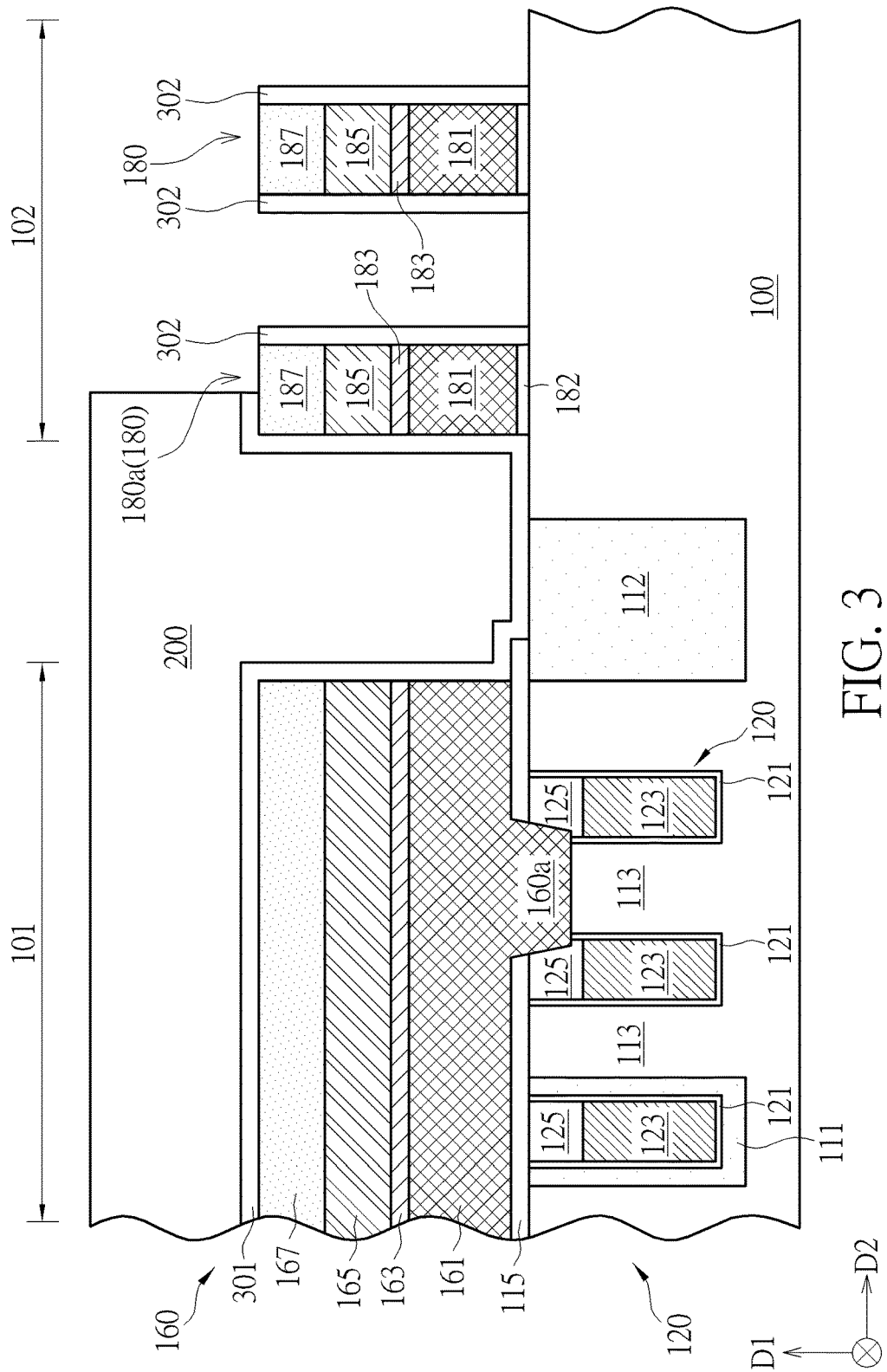

Afterwards, a spacer layer 301 and a spacer 302 are respectively formed on the bit line 160 and the gate 180. First, as shown in FIG. 2, a first material layer 300, such as a nitride, oxynitride or other suitable dielectric material, is formed on the substrate 100, such that the first material layer 300 can be uniformly and conformally covered on the bit line 160 of the memory region 101 and the gate 180 of the periphery region 102. In one embodiment, the first material layer 300 may include a multilayer structure, but is not limited thereto. A mask 200 is formed to cover a portion of the first material layer 300. In this embodiment, the mask 200 covers the entire memory cell region 101 and a portion of the periphery region 102, preferably partially covers the gate 180a closest to the memory cell region 101, as shown in FIG. 3.

Then, under the cover of the mask 200, an etching process, such as a dry etching process, is performed to remove the first material layer 300 exposed from the mask 200 and covering a top surface of the gate 180, thereby forming the spacers 302 merely covered on both sidewalls of the gate 180. It should be noted that the gate 180a closest to the memory cell region 101 has a spacer 302 disposed only on one side of the both sidewalls (for example, the right side) thereof because it is partially covered by the mask 200. On the other hand, the first material layer 300 covered by the mask 200 forms the spacer layer 301. As shown in FIG. 3, the spacer layer 301 simultaneously covers the entire bit line 160, the shallow trench isolation 112 and a portion of the gate 180 and directly contacts the bit line 160, the shallow trench isolation 112 and a portion of the gate structure 180. After the dry etching process, the mask 200 is completely removed.

Figure 4:
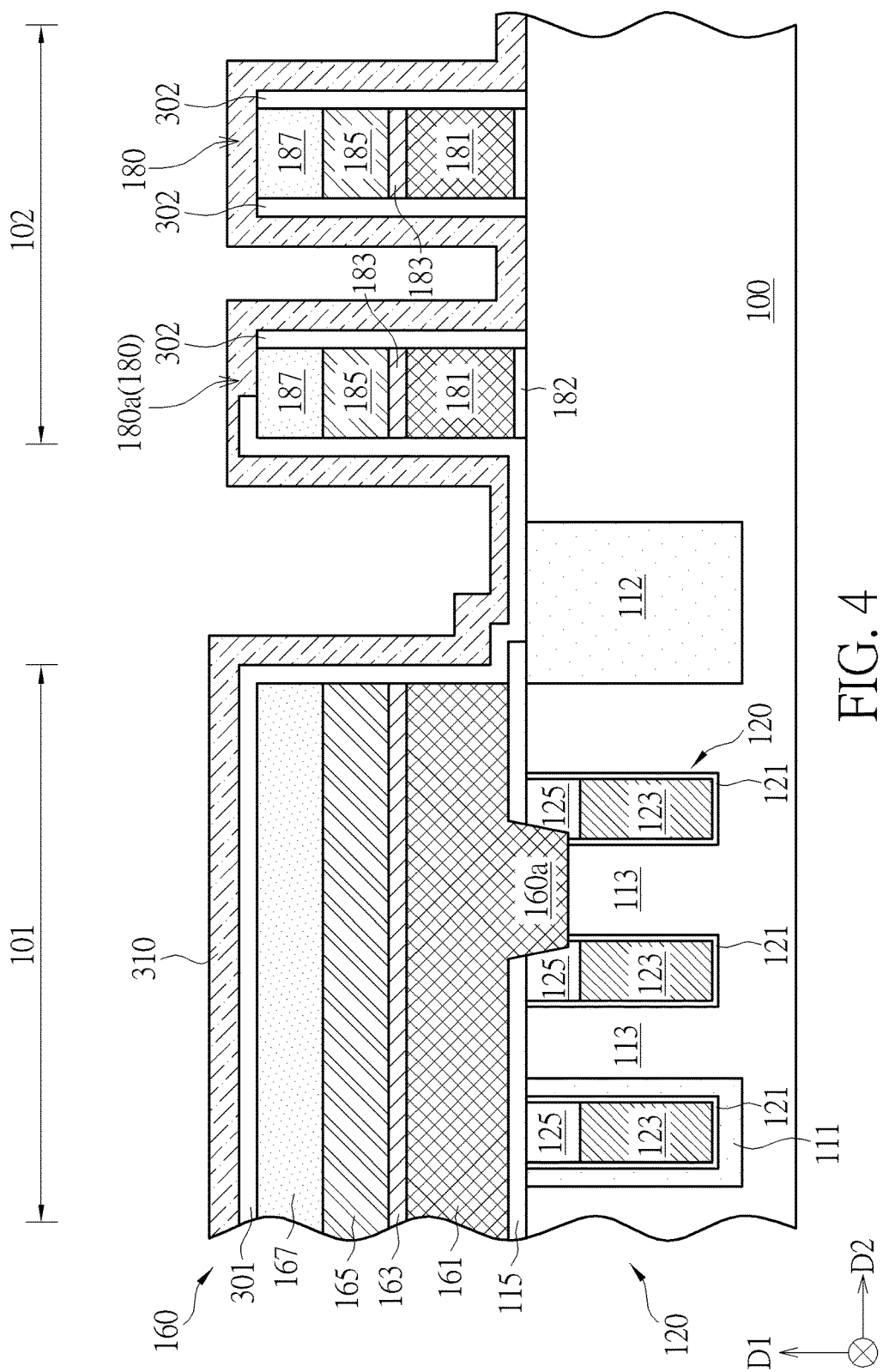
Figure 5:
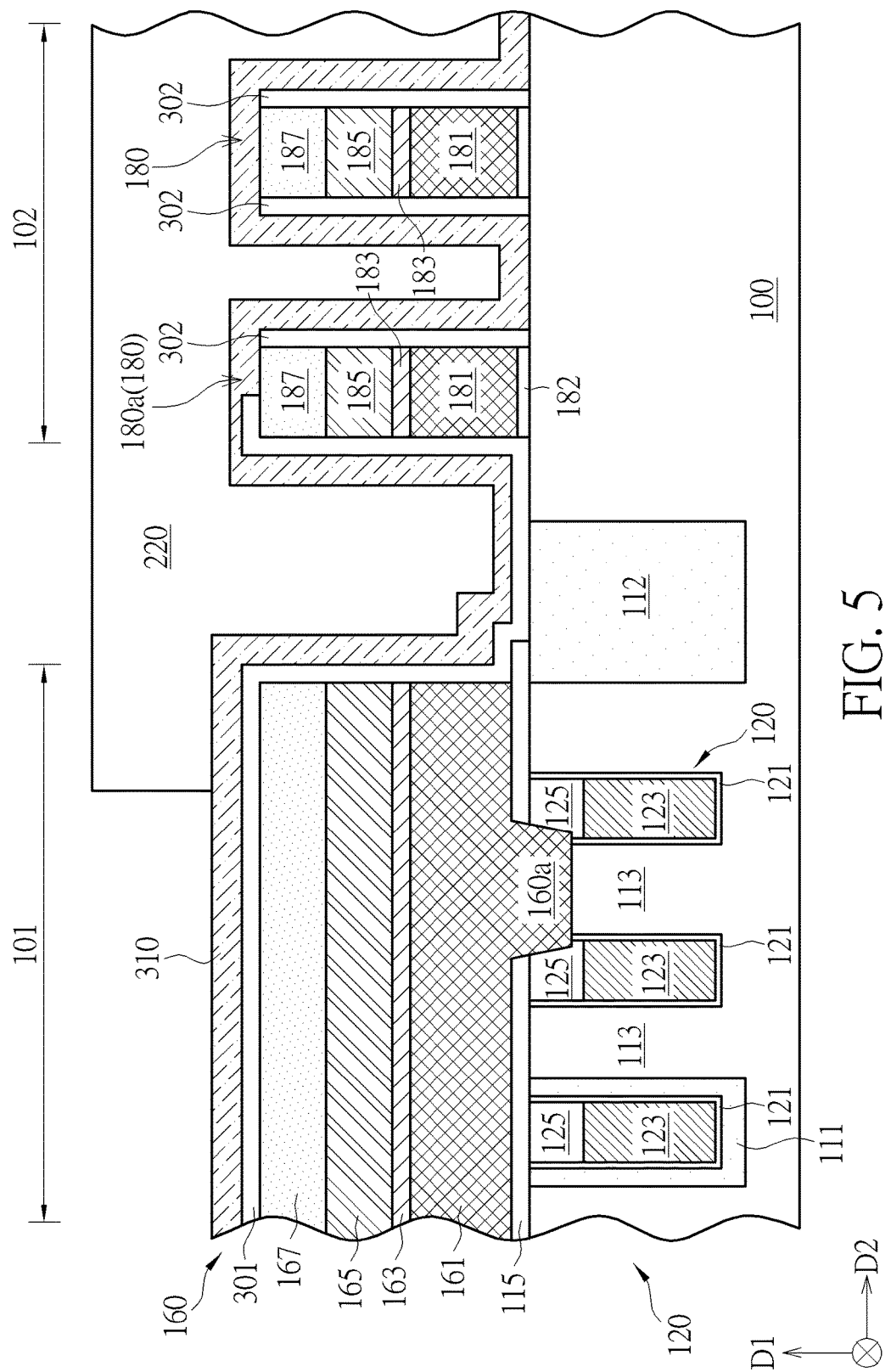

Next, a spacer 312 is further formed on the gate 180. First, as shown in FIG. 4, a second material layer 310 is formed on the entire surface of the substrate 100. The second material layer 310 includes, for example, a material with etching selectivity from the first material layer 300, such as silicon oxide. The second material layer 310 covers the spacer layer 301 and the spacer 302 and directly contacts at least a portion of the top surface of the gate 180. Then, a mask 220 is formed to cover a portion of the second material layer 310. In this embodiment, the mask 220 covers the entire periphery region 102 and a portion of the memory cell region 101, as shown in FIG. 5.

Figure 6:
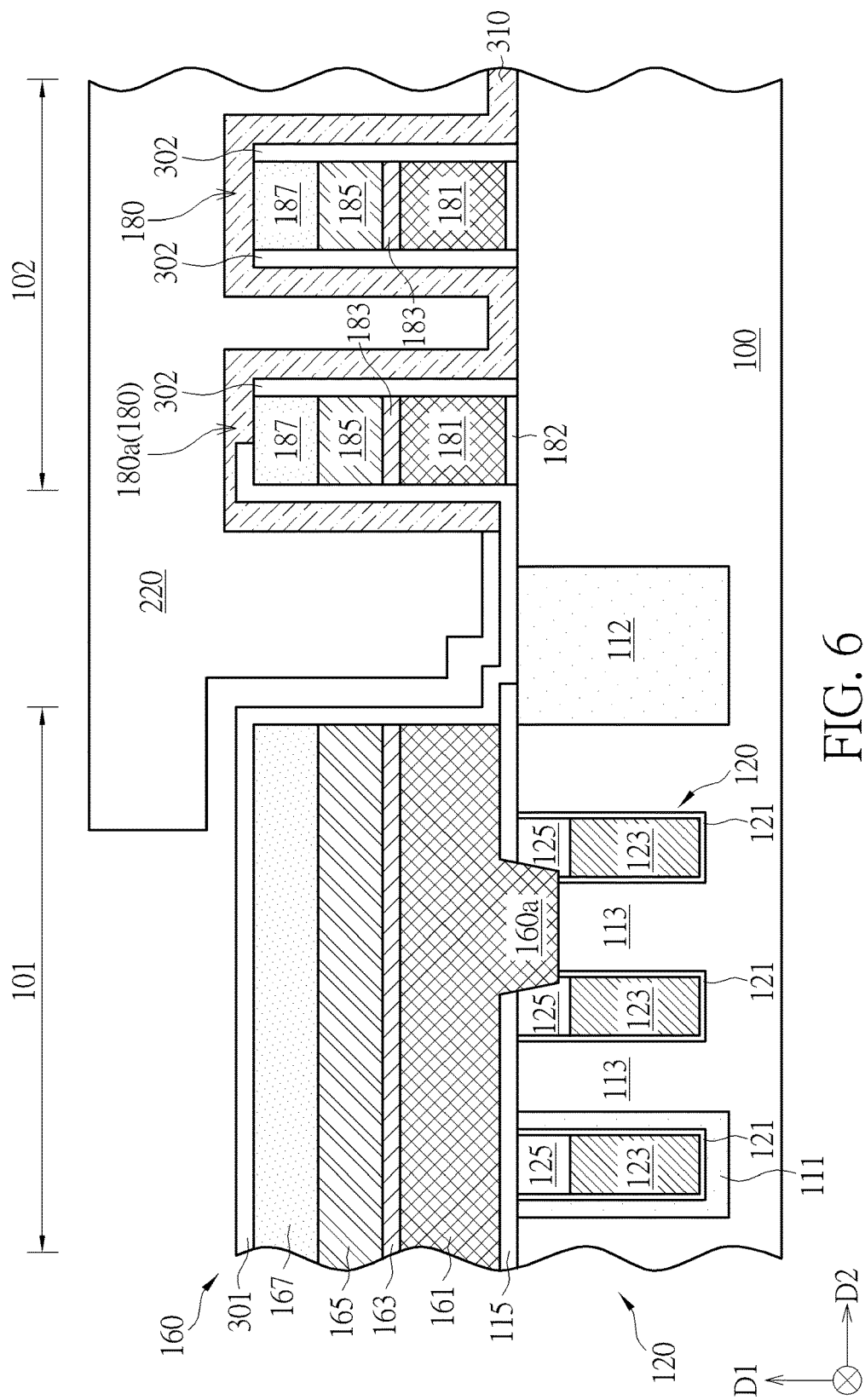
Figure 7:
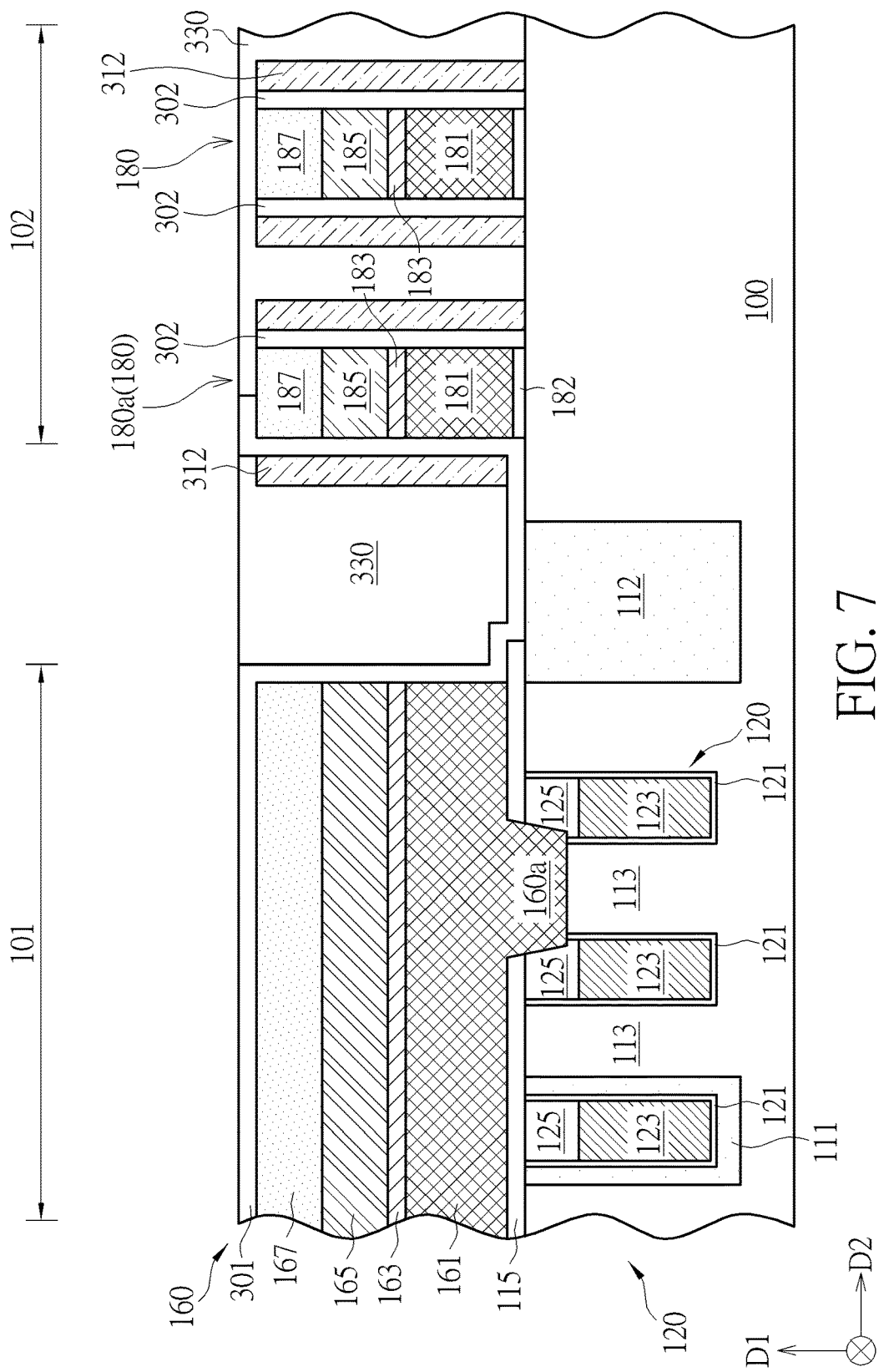

Then, under the cover of the mask 220, an etching process, such as a wet etching process, is performed to remove the second material layer 310 exposed from the mask 220 and further to remove a portion of the second material layer 310 covered by the mask 220. As shown in FIG. 6, the wet etching process completely removes the second material layer 310 located in the memory cell region 101, and uses the spacer layer 301 as an etch stop layer. Therefore, when the wet etching process is performed to remove the second material layer 310 covering the shallow trench isolation 112, the etchant does not continue to etch downward the spacer layer 301 and the shallow trench isolation 112. After the mask 220 is completely removed, another etching process, for example, a dry etching process, is performed to remove the second material layer 310 located on the top surface of the gate 180, thereby forming spacers 312 only covered on the both sidewalls of the gate 180 and covered on the spacer 302. It should be noted that the two opposite sidewalls of the gate 180a closest to the memory cell region 101 are covered by the spacer layer 301 and the spacer 302 respectively. Therefore, the spacer 312 subsequently formed on both sides of the gate 180a respectively cover the spacer layer 301 located on the left sidewall and the spacer 302 located on the right sidewall, as shown in FIG. 7. In addition, the top surface of the gate 180a is still partially covered by the spacer layer 301.

Finally, a deposition and planarization processes are performed sequentially to forma dielectric layer 330 on the substrate 100, wherein the dielectric layer 330 completely covers entire the gate 180 and the spacer layer 301 of the periphery region 102. A top surface of the dielectric layer 330 is flush with the spacer layer 301 located on the bit line 160 and the top surface of the gate 180a, as shown in FIG. 7.

Thus, the method of fabricating a semiconductor memory device in the first preferred embodiment of the present invention is completed. According to the formation method of this embodiment, the spacers 302 and 312 located on the sidewall of the gate 180 are respectively formed through two masks 200 and 220 and two etching processes. The mask 200 formed first covers the entire memory cell region 101 and a portion of the periphery region 102 such that the gate 180a closest to the memory cell region 101 is only partially exposed outside the mask 200. The independent spacers 302 are respectively formed on two opposite sidewalls of the gate 180. Furthermore, the mask 200 further covers the spacer layer 301 covering the shallow trench isolation 112 and the bit line 160. Therefore, in the subsequent etching process, the spacer layer 301 can be used as an etch stop layer to avoid the influence of the etching process on the shallow trench isolation 112 under the interface between the memory cell region 101 and the periphery area 102, so that the semiconductor memory device can achieve a better device performance.

On the other hand, the semiconductor memory device formed by the aforementioned formation method has the spacer layer 301 and the spacer 302 respectively formed on the two opposite sidewalls of the gate 180a adjacent to the memory cell region 101, such that the gate 180a has an asymmetrical spacer structure. The spacer layer 301 and the spacer 302 are formed by etching the first material layer 300 and have the same material. The spacer 302 only covers one side of the sidewalls of the gate 180a. The spacer layer 301 simultaneously covers the bit line 160 within the memory cell region 101, the shallow trench isolation 112 between the memory cell region 101 and the periphery region 102, and the opposite sidewall and a portion of top surface of the gate structure 180a. In addition, the spacers 312 formed subsequently cover the spacer layer 301 located on the left sidewall and the spacer 302 located on the right sidewall, respectively. The spacer 312 located on the left sidewall do not directly contact the surface of the substrate 100 due to being blocked by the spacer layer 301 under the spacer 312. Therefore, the spacer layer 301 can be used as an etch stop layer in the subsequent etching process to protect the elements under the spacer layer 301 such as the shallow trench isolation 112 and the like, so as to achieve the better device performance of the semiconductor memory device.

People well skilled in the art shall realize the method of fabricating semiconductor memory device in the present invention is not limited to be achieved through the aforementioned flow, and may also include other forming steps. The following description will detail the other embodiments or variational embodiments of the semiconductor memory device and method of forming the same in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
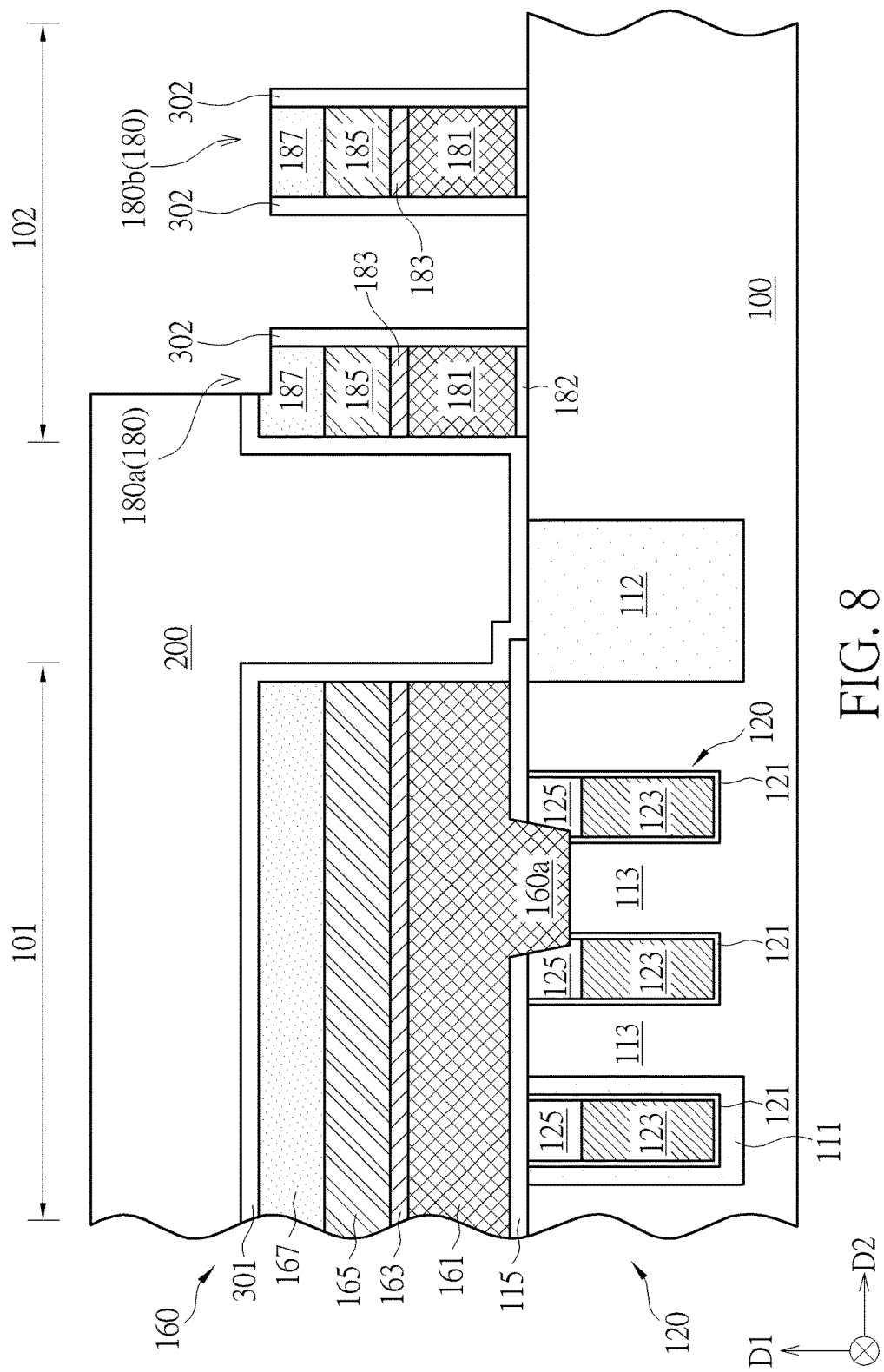
Figure 9:
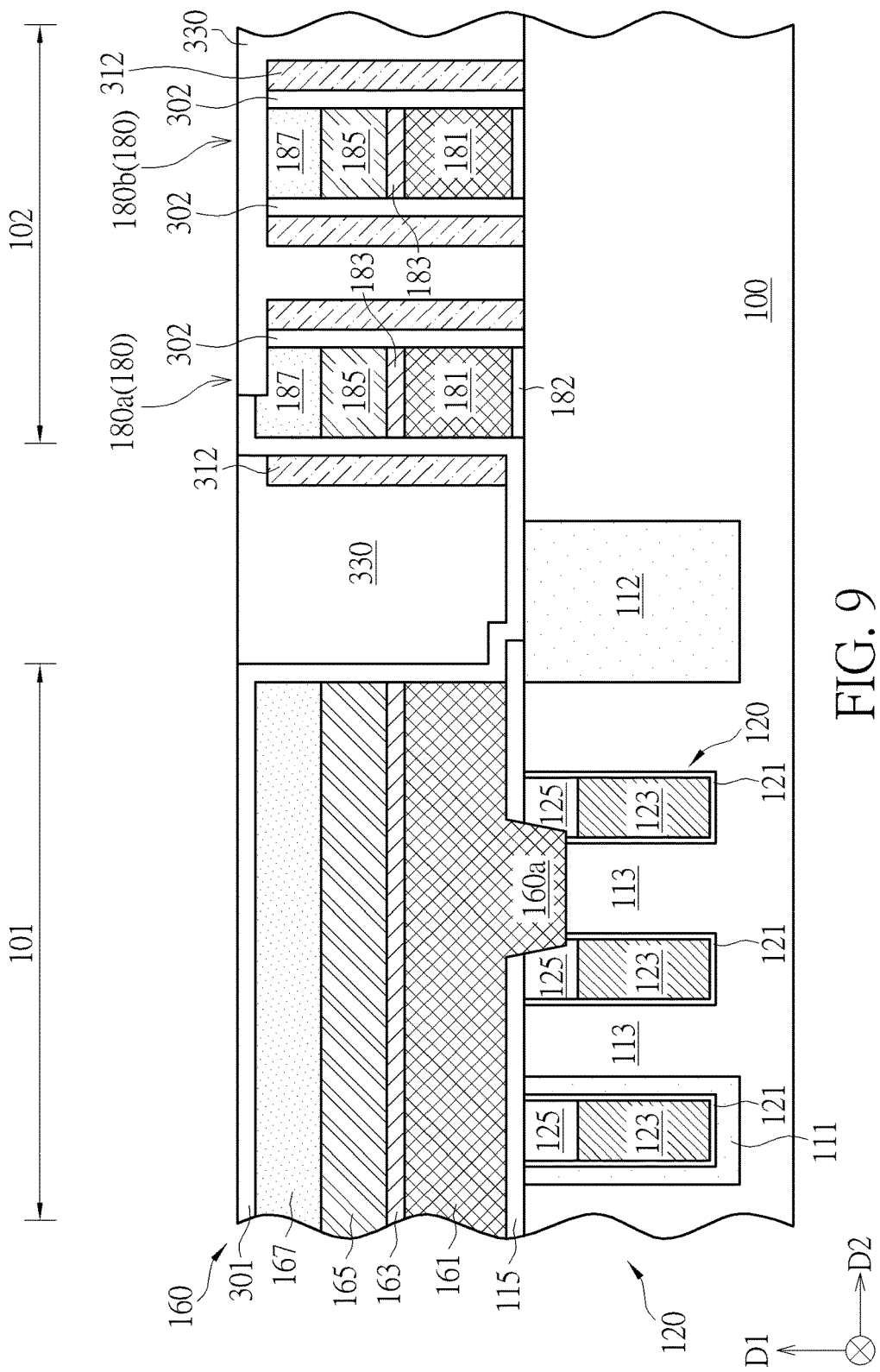

Please refer to FIG. 8 to FIG. 9, which are schematic views of steps of a method of fabricating a semiconductor memory device according to a second preferred embodiment of the present invention. The preceding steps in this embodiment are basically the same as those in the aforementioned first preferred embodiment, as shown in FIG. 1 to FIG. 2, which is not described herein again. The main difference between the fabricating process of the present embodiment and the aforementioned first preferred embodiment is that when the dry etching process of the first material layer 300 is performed under the cover of the mask 200, not only the first material layer 300 exposed from the mask 200 and covered on the top surface of the gate 180 are removed, but also a portion of the mask layer 187 is removed. Therefore, the gate 180b located in the periphery region 102 may have a lower top surface than the bit line 160 located in the memory cell region 101, as shown in FIG. 8. It should be note that the one side (for example, the left side) of the gate structure 180a is covered by the mask 200, so that only the other side (for example, the right side) of the mask layer 187 is partially removed to form a lower top surface. Thus, a top of the gate 180a may form a stair portion exposed outside the spacer layer 301 and having a lower top surface, as shown in FIG. 8.

The subsequent steps are also basically the same as the aforementioned first preferred embodiment, as shown in FIG. 4 to FIG. 7, which is not described herein again. When the dielectric layer 330 is formed through the deposition and planarization processes, the stair portion of the gate 180a and the gate 180b may optionally be completely covered by the dielectric layer 330, and the dielectric layer 330 may be flush with the spacer layer 301 disposed on the top surface of the gate 180a and the bit line 160, as shown in FIG. 9. However, in another embodiment, when performing the planarization process of the dielectric layer, the stair portion and a portion of the bit line 160 (for example, the mask layer 167) may be removed at the same time so that the top surface of the dielectric (not shown) is flush with the top surface of the bit line within the memory cell region 101 and the top surface of the gate within the periphery region 102.

Thus, the method of fabricating a semiconductor memory device in the second preferred embodiment of the present invention is completed. According to the formation method of this embodiment, the spacers 302 and 312 located on the sidewall of the gate 180 are respectively formed through two masks 200 and 220 and two etching processes. When the spacers 302 are formed, the spacer layer 301 is simultaneously formed on a side of the gate 180*a* closest to the memory cell region 101 and covering the shallow trench isolation 112 and the bit line 160. Therefore, in the subsequent etching process, the spacer layer 301 can be used as an etch stop layer to avoid the influence of etching process on the shallow trench isolation 112 under the interface between the memory cell region 101 and the periphery area 102, so that the semiconductor memory device can achieve a better device performance.

On the other hand, the semiconductor memory device formed by the present formation method has the spacer layer 301 and the spacer 302 respectively formed on the two opposite sidewalls of the gate 180*a* adjacent to the memory cell region 101, such that the gate 180*a* has an asymmetrical spacer structure. In addition, the gate 180*a* of the present embodiment further removes a portion of the mask layer 187 when forming the spacer layer 301 and the spacers 302, such that the gate structure 180*b* located in the periphery region 102 has a lower top surface than the bit line 160 located in the memory cell region 101. Moreover, the top portion of the gate 180*a* may be formed a stair portion due to only one side of the mask layer 187 of the gate structure 180*a* adjacent to the memory cell region 101 is partially removed.

Overall, the present invention utilizes the difference between the area covered by two masks, so that the spacer layer which is formed first can be used as an etch stop layer in a subsequent etching process so as to prevent the etching process from being over etched downward and damaging the components in the substrate. Thus, the semiconductor memory device achieved by the aforementioned formation method can have an optimized structural feature and achieve better device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device comprising:
   a substrate, wherein the substrate comprises a memory cell region and a periphery region;
   a plurality of bit lines, disposed on the substrate, within the memory cell region;
   a gate, disposed on the substrate, within the periphery region;
   a spacer layer covering the bit lines and a sidewall of the gate; and
   a first spacer disposed on the sidewall and an opposite sidewall of the gate and covering the spacer layer.

2. The semiconductor memory device according to claim 1, wherein the spacer layer partially covers a top surface of the gate.

3. The semiconductor memory device according to claim 2, wherein the top surface of the gate comprises a stair portion exposed outside the spacer layer.

4. The semiconductor memory device according to claim 1, wherein the semiconductor memory device further comprises:
   a second spacer covering the opposite sidewall of the gate, wherein the first spacer covers on the second spacer.

5. The semiconductor memory device according to claim 4, wherein the second spacer and the spacer layer comprise a same material.

6. The semiconductor memory device according to claim 4, wherein the second spacer and the spacer layer comprise a multilayer structure.

7. The semiconductor memory device according to claim 1, wherein the semiconductor memory device further comprises:
   a dielectric layer, disposed between the bit lines and the gate, wherein a portion of the dielectric layer covers the gate.

8. The semiconductor memory device according to claim 1, wherein the semiconductor memory device further comprises:
   a shallow trench isolation, disposed within the substrate and between the memory region and the periphery region, wherein the spacer layer covers the shallow trench isolation.

9. A method of fabricating a semiconductor memory device, comprising:
   providing a substrate, wherein the substrate comprises a memory cell region and a periphery region;
   forming a plurality of bit lines on the substrate, wherein the bit lines are located within the memory cell region;
   forming a gate on the substrate, wherein the gate is located within the periphery region;
   forming a spacer layer covering the bit lines and a sidewall of the gate; and
   forming a first spacer on the sidewall and an opposite sidewall of the gate, wherein the first spacer covers the spacer layer.

10. The method for fabricating a semiconductor memory device according to claim 9, the method further comprises:
    forming a second spacer covering the opposite sidewall of the gate, wherein the first spacer covers the second spacer.

11. The method of fabricating a semiconductor memory device according to claim 10, wherein the second spacer and the spacer layer are formed simultaneously.

12. The method of fabricating a semiconductor memory device according to claim 10, wherein forming the spacer layer and the second spacer comprises:
    forming a first material layer covering on the bit lines and the gate;
    forming a mask covering the bit lines and partially covering the gate; and
    performing an etching process, wherein the first material layer covered on a top surface of the gate is partially removed, thereby forming the spacer layer and the first spacer.

13. The method of fabricating a semiconductor memory device according to claim 12, wherein a portion of the gate is removed when the first material layer is partially removed.

14. The method of fabricating a semiconductor memory device according to claim 9, wherein the method further comprises:
    forming a shallow trench isolation within the substrate and between the bit lines and the gate, wherein the spacer layer covers the shallow trench isolation.

15. The method of fabricating a semiconductor memory device according to claim 9, wherein forming the first spacer comprises:
   forming a second material layer covering the bit lines and the gate;
   removing the second material layer covered on the bit lines; and
   further removing the second material layer covered on the top surface of the gate.

16. The method of fabricating a semiconductor memory device according to claim 9, wherein the method further comprises:
   forming a dielectric layer, disposed between the bit lines and the gate, wherein a portion of the dielectric layer covers the gate.

* * * * *